(12) United States Patent
Juanes Ribas et al.

(10) Patent No.: US 9,905,947 B2
(45) Date of Patent: Feb. 27, 2018

(54) VENTED ELECTRICAL TERMINAL BLOCK

(71) Applicant: Lear Corporation, Southfield, MI (US)

(72) Inventors: Ferran Juanes Ribas, Valls (ES);
Montserrat Piñol Pedret, Valls (ES);
Enric Aparicio Rollan, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 15/292,746

(22) Filed: Oct. 13, 2016

(65) Prior Publication Data
US 2017/0117648 A1    Apr. 27, 2017

Related U.S. Application Data

(60) Provisional application No. 62/244,984, filed on Oct. 22, 2015.

(51) Int. Cl.
| | |
|---|---|
| H01R 12/00 | (2006.01) |
| H01R 12/71 | (2011.01) |
| H01R 4/02 | (2006.01) |
| H01R 12/58 | (2011.01) |
| H01R 43/02 | (2006.01) |
| H01R 43/20 | (2006.01) |
| H05K 1/18 | (2006.01) |
| H05K 3/30 | (2006.01) |
| H05K 3/34 | (2006.01) |
| H05K 3/28 | (2006.01) |

(52) U.S. Cl.
CPC .......... *H01R 12/716* (2013.01); *H01R 4/028* (2013.01); *H01R 12/58* (2013.01); *H01R 43/0256* (2013.01); *H01R 43/205* (2013.01); *H05K 1/181* (2013.01); *H05K 3/28* (2013.01); *H05K 3/308* (2013.01); *H05K 3/3447* (2013.01); *H05K 2201/1031* (2013.01); *H05K 2203/1327* (2013.01)

(58) Field of Classification Search
CPC .................................................. H01R 12/716
USPC ........................................................ 439/83
See application file for complete search history.

(56) References Cited

U.S. PATENT DOCUMENTS

| | | | |
|---|---|---|---|
| 2009/0321129 A1* | 12/2009 | Darr ............... | H05K 7/026 174/520 |
| 2015/0044889 A1* | 2/2015 | Wang .............. | H01R 12/707 439/83 |

* cited by examiner

*Primary Examiner* — Abdullah Riyami
*Assistant Examiner* — Nader Alhawamdeh
(74) *Attorney, Agent, or Firm* — Fishman Stewart PLLC

(57) ABSTRACT

In examples of the present disclosure, a vented electrical terminal block may include a body that may be configured to support a plurality of electrical terminals In examples, the body may include a plurality of side walls that may extend from the body. The body may include a plurality of apertures extending through the body. A cavity may be defined by an underside of the body. The cavity may receive a cavity fluid. In examples, at least one side wall may include an opening for receiving a sealing fluid, and apertures may be configured to vent said cavity fluid from the cavity when sealing fluid is introduced into the cavity via the opening.

20 Claims, 7 Drawing Sheets

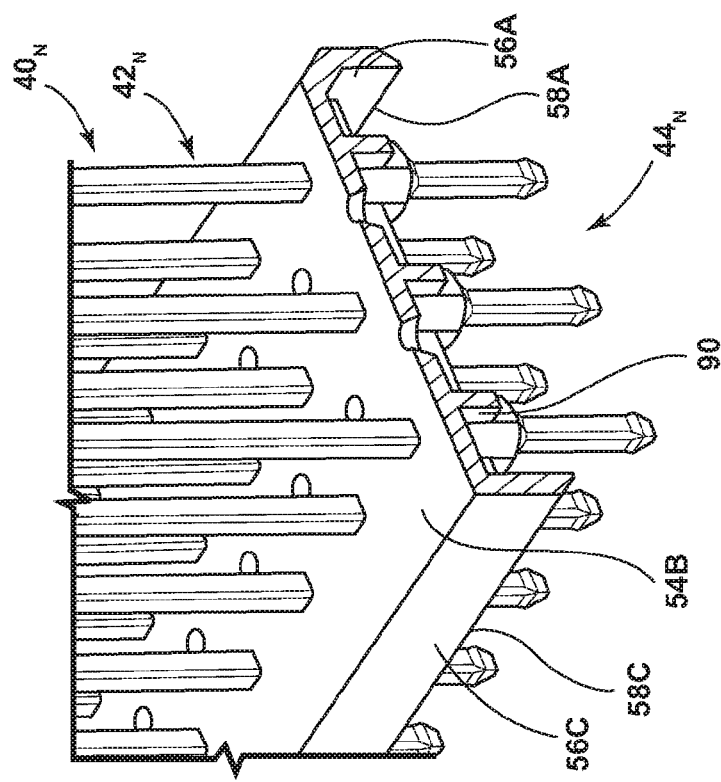
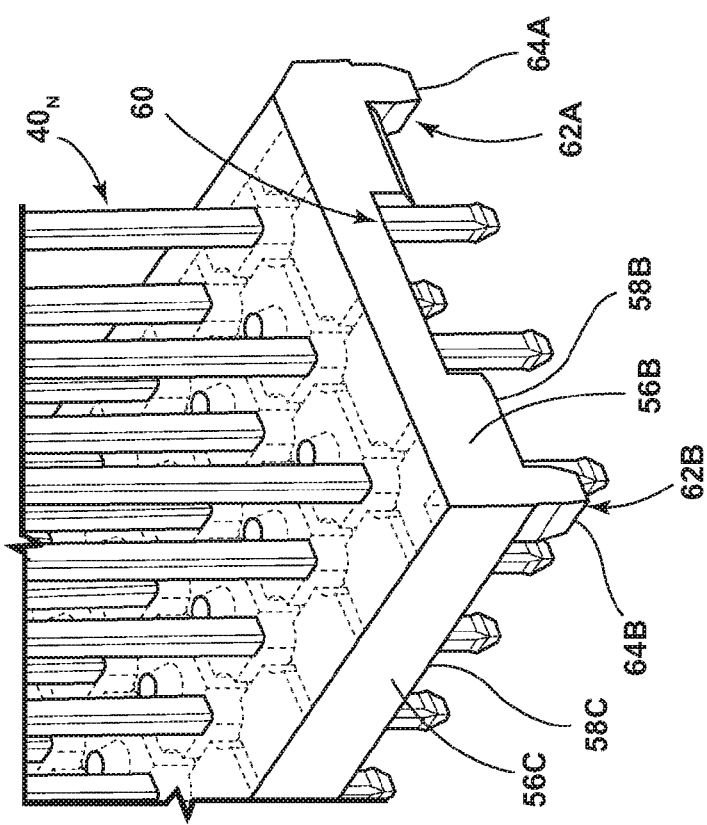

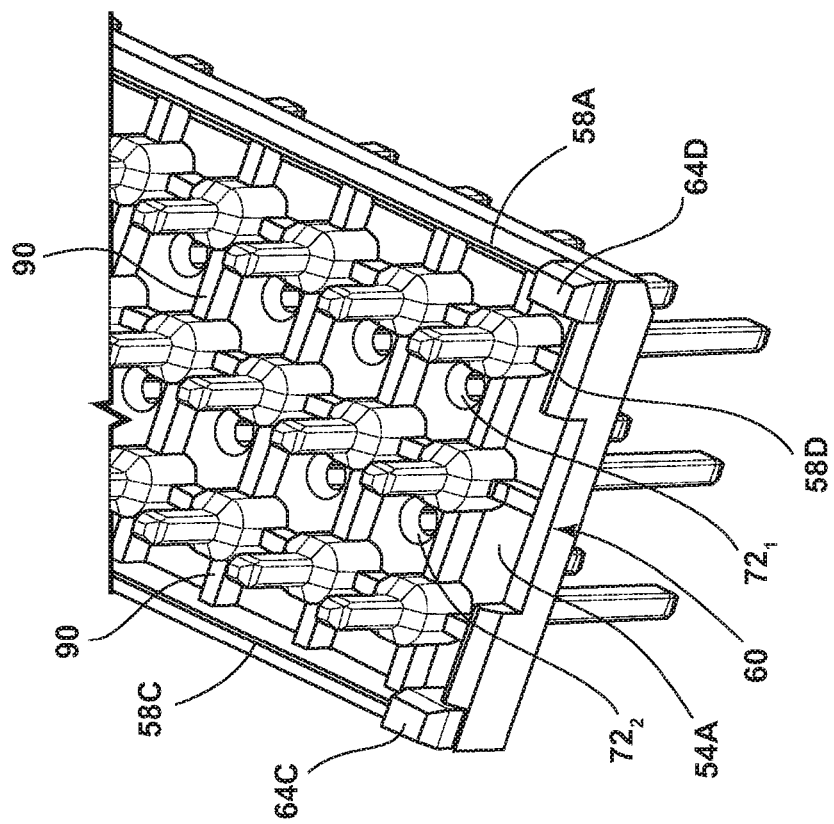
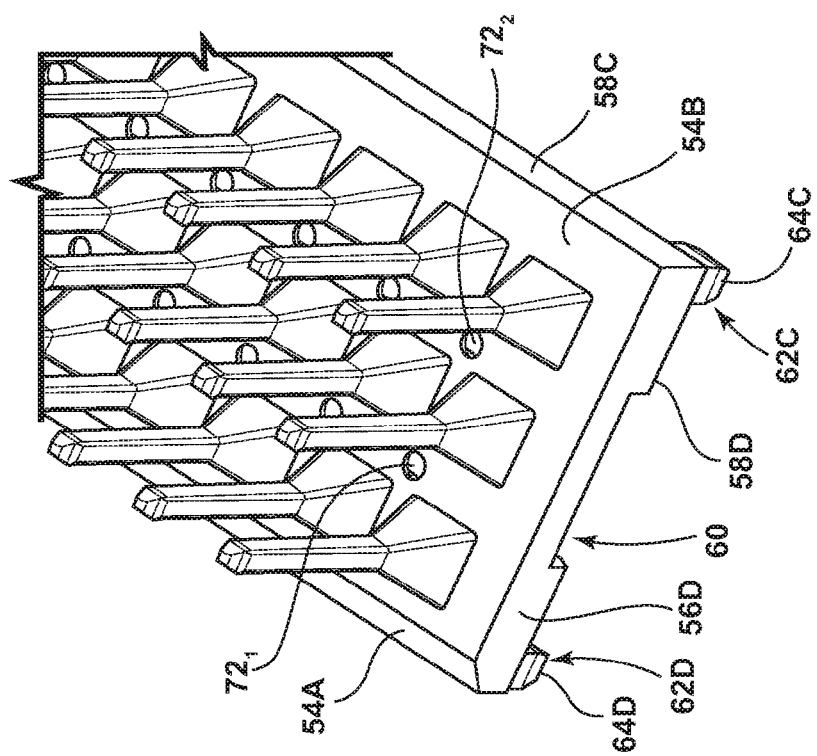
FIG. 4A
FIG. 4B

VENTED ELECTRICAL TERMINAL BLOCK

CROSS-REFERENCE TO RELATED APPLICATION

This application claims the benefit of U.S. Provisional Application Ser. No. 62/244,984, filed Oct. 22, 2015, the disclosure of which is hereby incorporated herein by reference in its entirety.

TECHNICAL FIELD

The present disclosure relates to electrical components, including electrical connectors, electrical terminals, and/or circuit boards.

BACKGROUND

This background description is set forth below for the purpose of providing context only. Therefore, any aspects of this background description, to the extent that it does not otherwise qualify as prior art, is neither expressly nor impliedly admitted as prior art against the instant disclosure.

In some circumstances, electrical pins and/or terminals may be connected to a circuit board via a terminal block. Electrical terminals may extend out from the top and/or bottom of the terminal block. Top portions of the electrical terminals may extend out from the top of the terminal block and may be configured for connection with an electrical connector, such as for an electrical wiring harness. Bottom portions of the electrical terminals may extend down from the bottom of the terminal block so that they may extend through a circuit board. The bottom portions of the electrical terminals may be fixed to the circuit board, such as with solder to the bottom of the circuit board. The solder may flow into the holes of the circuit board through which the bottom portions extend and the solder may flow to the top side of the circuit board such that solder is present between the bottom of the terminal block and the top of the circuit board. In some circumstances, it may be desirable to coat solder with a material that may help prevent corrosion and/or wear, such as a varnish. Coating the solder present at the bottom of the circuit board may be relatively straightforward as the solder may be easily accessible. Coating the solder present between the bottom of the terminal block and the top of the circuit board may be challenging as the terminal block may limit access to such solder.

There is therefore a desire for solutions/options that minimize or eliminate one or more of the above-described challenges. The foregoing discussion is intended only to illustrate a potential field of use and should not be taken as a disavowal of scope.

SUMMARY

In embodiments of the present disclosure, a circuit board assembly may comprise a circuit board and a vented terminal block that may be connected to the circuit board. The vented terminal block may include a body configured to support a plurality of electrical terminals. The body may include a plurality of feet that may extend from the body to support the body on a circuit board, a plurality of apertures that may extend through the body, a cavity defined between the body and the circuit board, and/or a cavity fluid disposed in the cavity. The body may include an opening that may be configured to receive a sealing fluid, and/or the plurality of apertures may be configured to vent said cavity fluid from the cavity when said sealing fluid is introduced into the cavity via the opening. The circuit board assembly may comprise a plurality of electrical terminals connected to the vented terminal block. The plurality of electrical terminals may be electrically connected with the circuit board. At least some of the plurality of apertures may be substantially centered between respective electrical terminals of the plurality of electrical terminals. The plurality of apertures may extend through a top of the body. The body may include a plurality of side walls extending that may extend toward the circuit board. Bottoms of the plurality of side walls may be disposed at a distance from the circuit board. The distance may be about 1.0 mm. The opening may be disposed in at least one side wall of the plurality of side walls and/or may reduce a surface area of the at least one side wall. A thickness of the body may be about 0.5 mm. At least one aperture of the plurality of apertures may include a tapered configuration such that a diameter of the at least one aperture is greater at a bottom side of the body than at a top side of the body. In embodiments, an electrical junction box may include the circuit board assembly.

In embodiments, a vented electrical terminal block may comprise a body that may be configured to support a plurality of electrical terminals. The body may comprise a plurality of apertures that may extend through the body, and/or a cavity that may be defined by an underside of the body (e.g., disposed between the body and a plane that may be defined by bottoms of the plurality of feet). The cavity may be configured to receive a cavity fluid. At least one side wall of the plurality of side walls may include an opening that may be configured to receive a sealing fluid. The plurality of apertures may be configured to vent said cavity fluid from the cavity when said sealing fluid is introduced into the cavity via the recess. At least one aperture of the plurality of apertures may include a tapered configuration such that a diameter of the at least one aperture is greater at a bottom side of the body than at a top side of the body. The body may include a plurality of side walls that may extend from the body, and/or include a plurality of feet that may extend from the body beyond the plurality of side walls to support the body on a circuit board, In embodiments, a method of assembling an electrical junction box may include connecting a vented terminal block to a circuit board, soldering electrical terminals of the vented terminal block to the circuit board, inserting a sealing fluid into a cavity defined between the circuit board and the vented terminal block, and/or venting a cavity fluid out of the cavity via a plurality of apertures in the vented terminal block. Connecting the vented terminal block with the circuit board may include inserting portions of electrical terminals into corresponding apertures in the circuit board. The vented terminal block may include a body. The body may include a plurality of side walls that may extend from the body, and a plurality of feet that may extend from the body beyond the plurality of side walls to support the body on the circuit board, a plurality of apertures that may extend through the body. At least one side wall of the plurality of side walls may include an opening that may be configured to receive the sealing fluid. The plurality of apertures may be configured to vent said cavity fluid from the cavity when said sealing fluid is introduced into the cavity via the recess. The cavity fluid may include an exhaust fluid resulting from a curing of the sealing fluid. The venting of the cavity fluid may limit a formation of gas bubbles in the sealing fluid. Soldering electrical terminals may include soldering portions of the electrical terminals that extend beyond a bottom surface of the circuit board following insertion. During the soldering of the portions of the electrical terminals, solder may flow through the circuit board from the bottom surface to a top surface of the circuit board. The sealing fluid may be configured to protect the solder at the top surface.

BRIEF DESCRIPTION OF THE DRAWINGS

FIG. 3A is a perspective view of an embodiment of a vented terminal block, with the top surface of the vented terminal block hidden, in accordance with teachings of the present disclosure.

FIG. 3B is a cross-sectional perspective view of an embodiment of a vented terminal block in accordance with teachings of the present disclosure.

FIG. 4A is a perspective view of an embodiment of a vented terminal block in accordance with teachings of the present disclosure.

FIG. 4B is a perspective view of an embodiment of a vented terminal block in accordance with teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents, which may be included within the spirit and scope of the invention as defined by the appended claims.

Figures 1A, 1B:
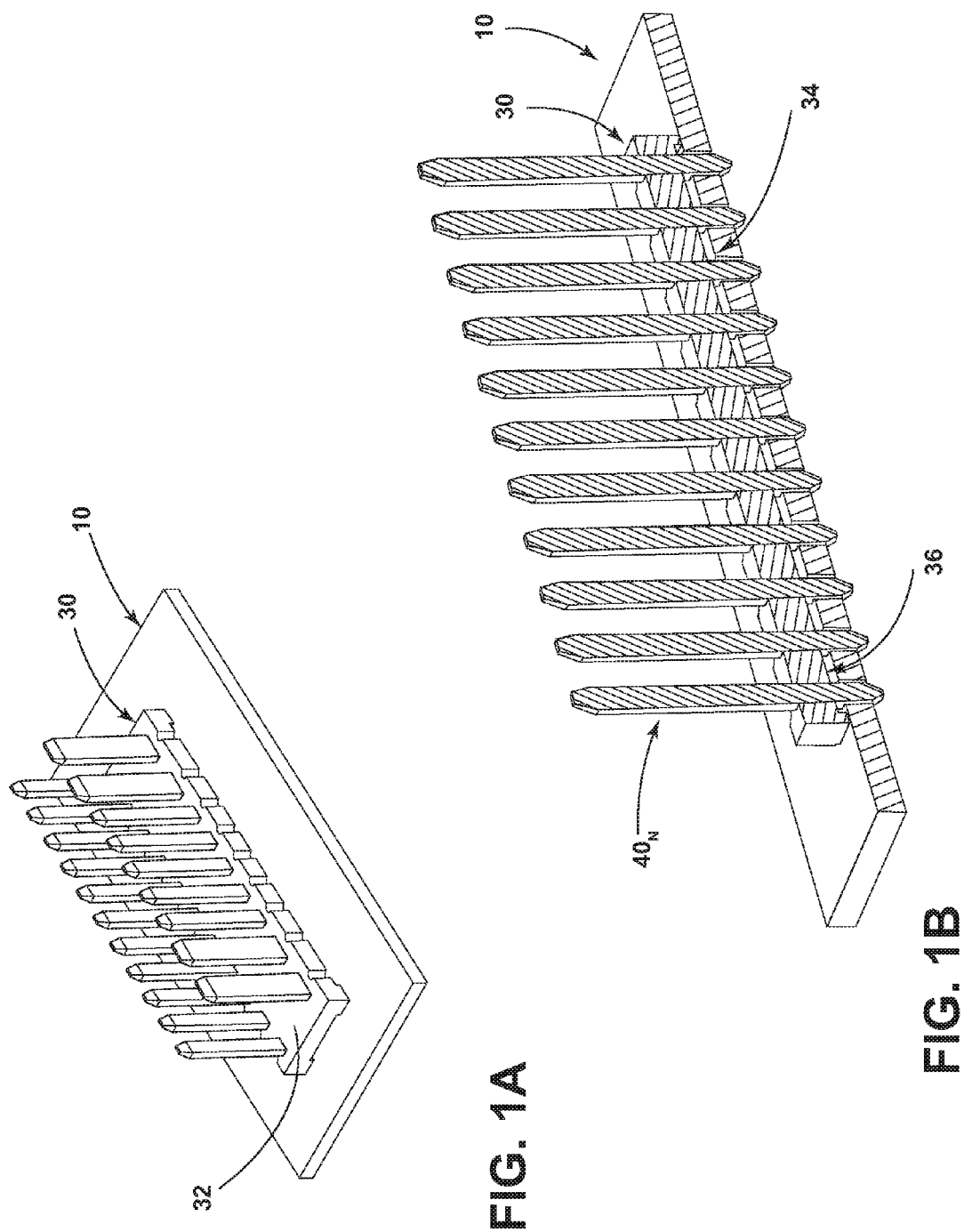
FIG. 1A is a perspective view of a terminal block attached to a circuit board.
FIG. 1B is a cross-sectional perspective view of a terminal block attached to a circuit board.

Referring to the drawings, FIGS. 1A and 1B generally illustrate a circuit board 10, which may include a printed circuit board (PCB), and a terminal block 30. Terminal block 30 may include a solid planar body 32 that may support one or more electrical terminals $40_N$ in a particular orientation (e.g., a vertical orientation). If terminal block 30 is mounted to circuit board 10, a cavity/chamber 34 may be defined/formed between terminal block 30 and circuit board 10.

Figure 2A:
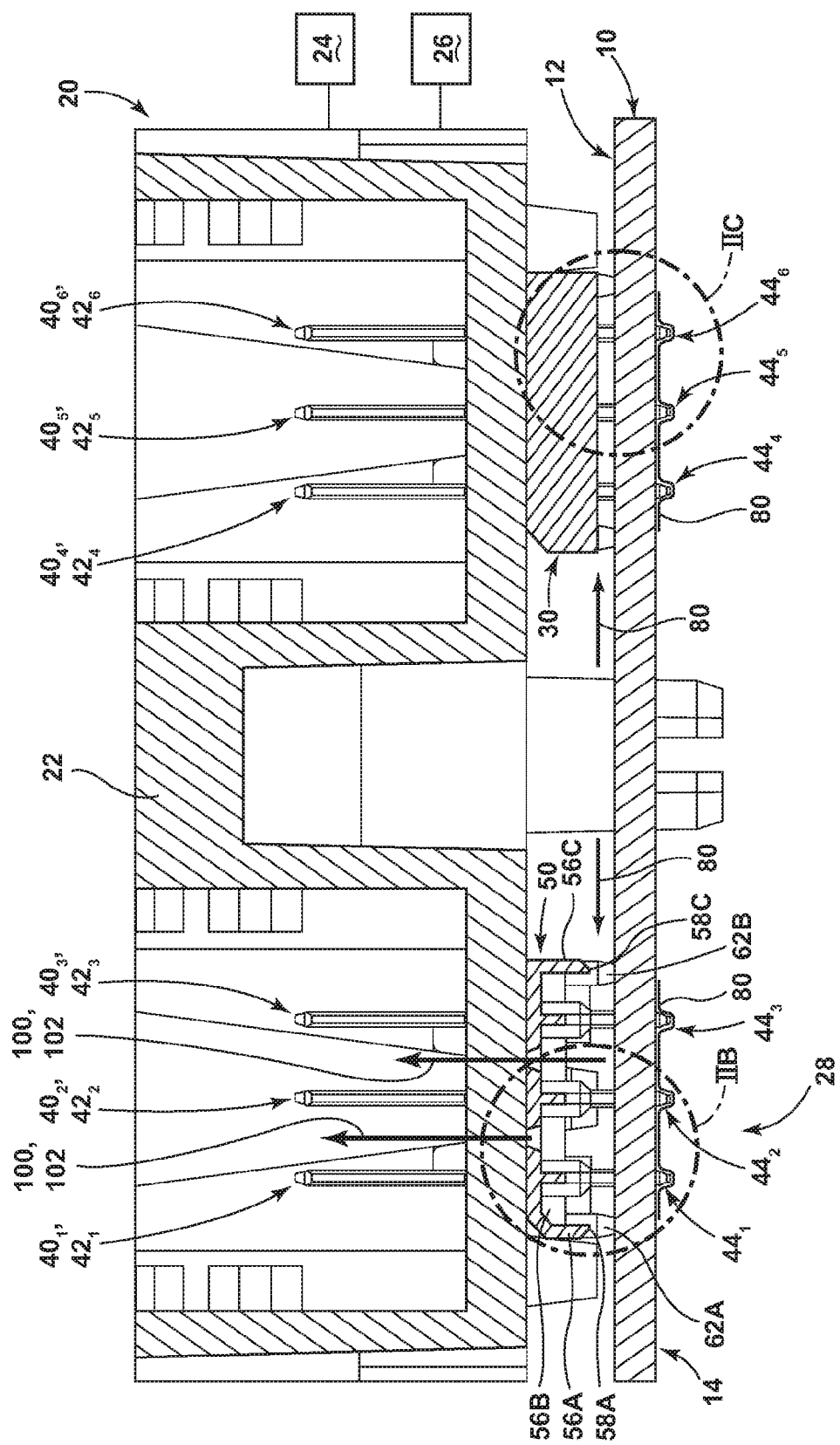
FIG. 2A is a cross-sectional view of an embodiment of a junction box including a terminal block, a vented terminal block, a circuit board, and a housing in accordance with teachings of the present disclosure.
Figure 2C:
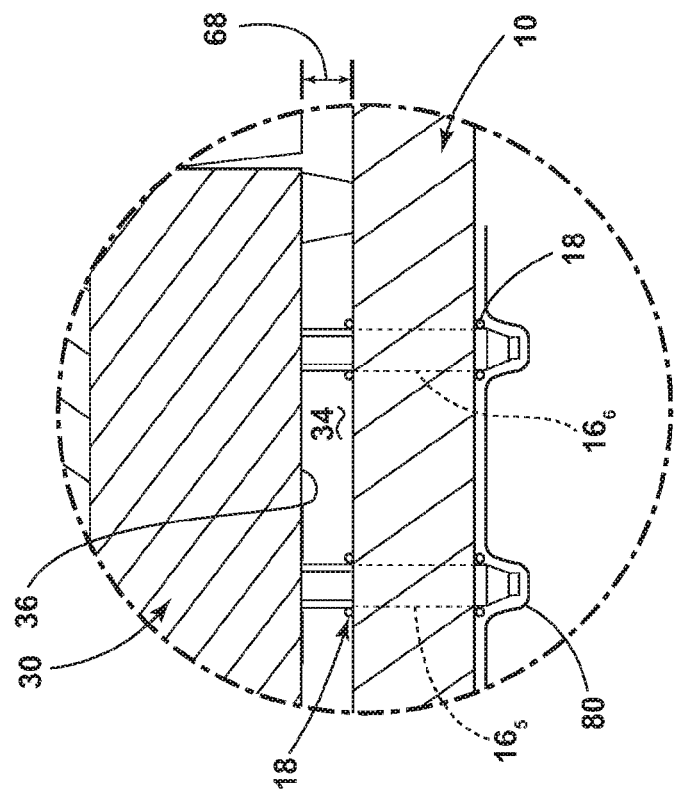
FIG. 2C is an enlarged cross-sectional view of portions of the embodiment of a junction box of FIG. 2A, including a terminal block.
Figure 2B:
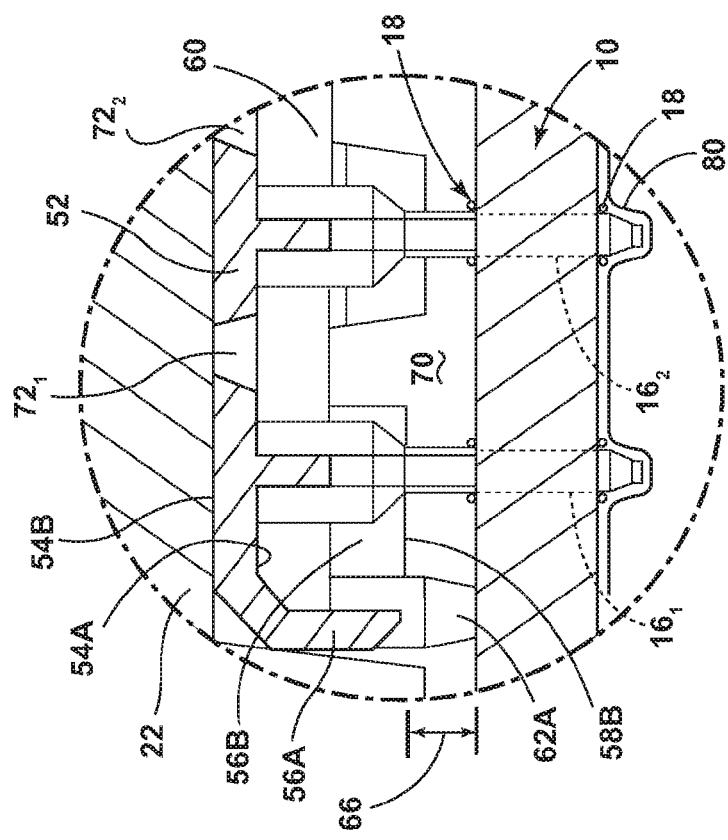
FIG. 2B is an enlarged cross-sectional view of portions of the embodiment of a junction box of FIG. 2A, including a vented terminal block, a circuit board, and a housing in accordance with teachings of the present disclosure.

In embodiments, such as generally illustrated in FIGS. 2A and 2B, a vented terminal block 50 may be used in connection with circuit board 10, an electrical junction box 20, and/or a housing 22 of electrical junction box 20. A circuit board assembly 28 may include circuit board 10, vented terminal block 50, and/or one or more other components. In embodiments, electrical junction box 20 may include circuit board assembly 28, an electronic control unit (ECU) 24, and/or a power distribution unit (PDU) 26.

Figure 5A:
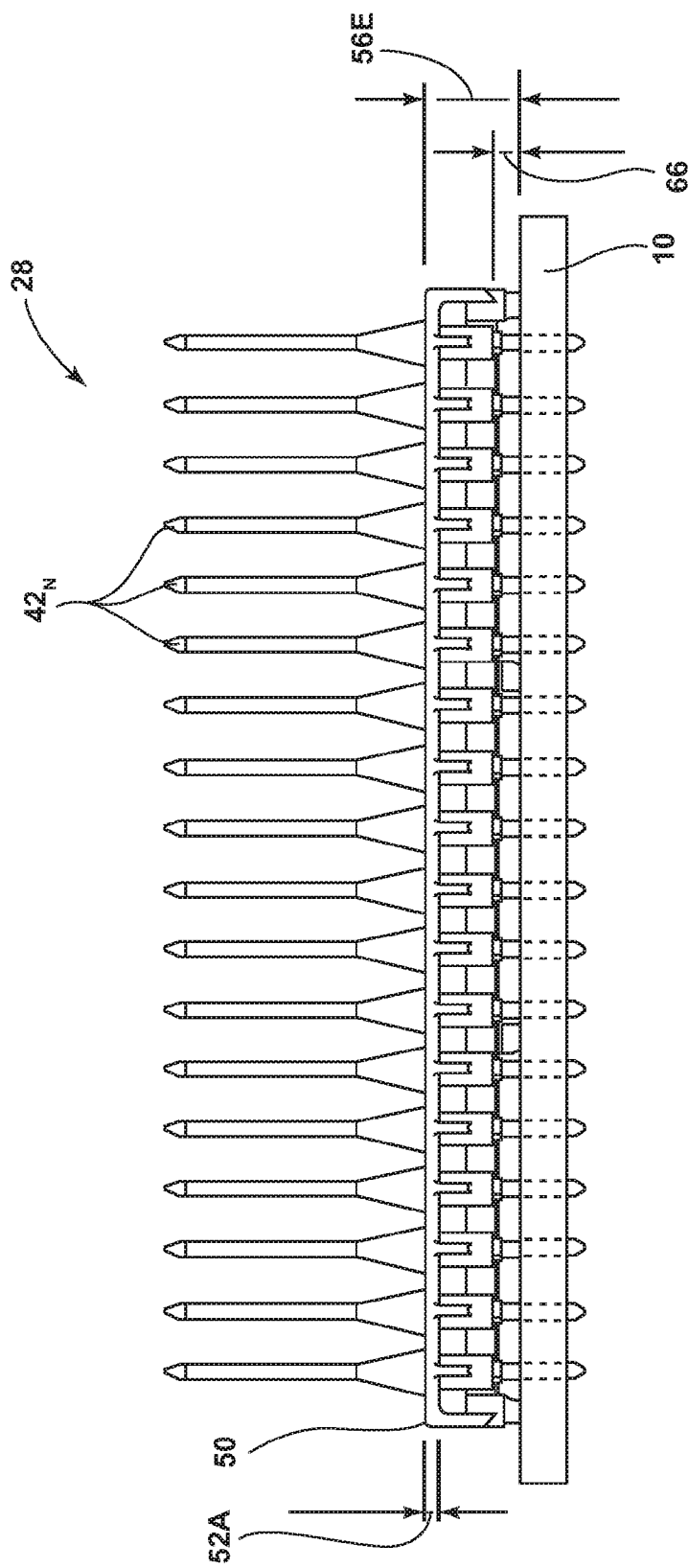
FIG. 5A is a cross-sectional view of an embodiment of a circuit board assembly, including a vented terminal block and a circuit board in accordance with teachings of the present disclosure.

In embodiments, such as generally illustrated in FIGS. 2A, 2B, 3A, 3B, 4A, and 4B, vented terminal block 50 may include a body 52. In embodiments, body 52 may include one or more of a variety of shapes, sizes, configurations, and/or materials. For example, and without limitation, body 52 may include a generally rectangular shape and may include plastic. In embodiments, body 52 may include a plurality of side walls (e.g., side walls 56A, 56B, 56C, 56D) that may extend (e.g., perpendicularly) from body 52, such as toward circuit board 10. In embodiments, terminal block 50 may include a plurality of feet (e.g., feet 62A, 62B, 62C, 62D) that may extend (e.g., perpendicularly) from body 52 and/or may extend generally parallel to side walls 56A, 56B, 56C, 56D. Feet 62A, 62B, 62C, 62D may extend beyond the bottoms 58A, 58B, 58C, 58D of side walls 56A, 56B, 56C, 56D such that if terminal block 50 is disposed on and/or adjacent to circuit board 10, feet 62A, 62B, 62C, 62D may contact circuit board 10 and the bottoms 58A, 58B, 58C, 58D of side walls 56A, 56B, 56C, 56D may be disposed at a distance from circuit board 10 (e.g., there may be a gap 66 between side walls 56A, 56B, 56C, 56D and circuit board 10 if terminal block 50 is mounted to circuit board 10). For example, and without limitation, gap 66 may be about 1 mm (see, e.g., FIG. 5A). Terminal block 50 may have a height 56E.

In embodiments, a cavity 70 may be defined between vented terminal block 50 and circuit board 10. For example, and without limitation, bottoms 64A, 64B, 64C, 64D of feet 62A, 62B, 62C, 62D may define a plane that may be parallel to and/or coincident with top surface 12 of circuit board 10. In embodiments, cavity 70 may be defined by a lower surface 54A of body 52, side walls 56A, 56B, 56C, 56D, and the bottoms 64A, 64B, 64C, 64D of feet 62A, 62B, 62C, 62D (e.g., defined by an underside of body 52) and/or the top surface 12 of circuit board 10. In embodiments, a cavity fluid 100 may be disposed in cavity 70. Cavity fluid 100 may include, for example, and without limitation, air.

In embodiments, an electrical terminal (e.g., one or more of electrical terminals $40_N$) may include a first portion $42_N$ that may extend above body 52 (e.g., away from circuit board 10) and/or a second portion $44_N$ that may extend below body 52 (e.g., toward circuit board 10). First portion $42_N$ may be configured for connection with a connector, such as a wiring harness male connector (which may include corresponding female terminals) that may be used, for example, in a vehicle. In embodiments, first portion $42_N$ may extend perpendicularly to body 52 and may be configured to extend through a portion of housing 22 and into a connector. In embodiments, first portions $42_N$ may be generally vertical and/or first portions $42_N$ (which may or may not all be the same) may be angled (e.g., may be bent at an angle, such as about 90 degrees).

In embodiments, a second portion $44_N$ of an electrical terminal $40_N$ may be configured for connection with circuit board 10. For example, and without limitation, second portion $44_N$ may extend perpendicularly to body 52 and may extend vertically beyond feet bottoms 64A, 64B, 64C, 64D such that second portion $44_N$ may extend into and/or through a corresponding aperture $16_N$ in circuit board 10. In embodiments, second portion $44_N$ may be configured to be attached to and/or electrically connected to circuit board 10, such as via soldering. During soldering, some amount of solder 18 may flow through apertures $16_N$ in circuit board 10 and may reach the top surface 12 of circuit board 10 (e.g., may be present in cavity 70).

In embodiments, it may be desirable to apply a sealing and/or protective material 80 (e.g., a coating) to some or all of the solder 18 on circuit board 10 and/or within junction box 20. In embodiments, the sealing material 80 may include, for example, a varnish, and may be configured to prevent and/or reduce wear, corrosion, and/or deterioration of solder 18. Applying a sealing material 80 to the solder 18 at the bottom surface 14 of circuit board 10 may be relatively straightforward as the solder 18 may be exposed. In some designs, applying a sealing material 80 to solder 18 within a cavity covered by a terminal block (e.g., cavity 34 covered by terminal block 30) may be more difficult as solder 18 within the cavity may not be easily accessible (see, e.g., FIGS. 2A and 2C).

Figure 5B:
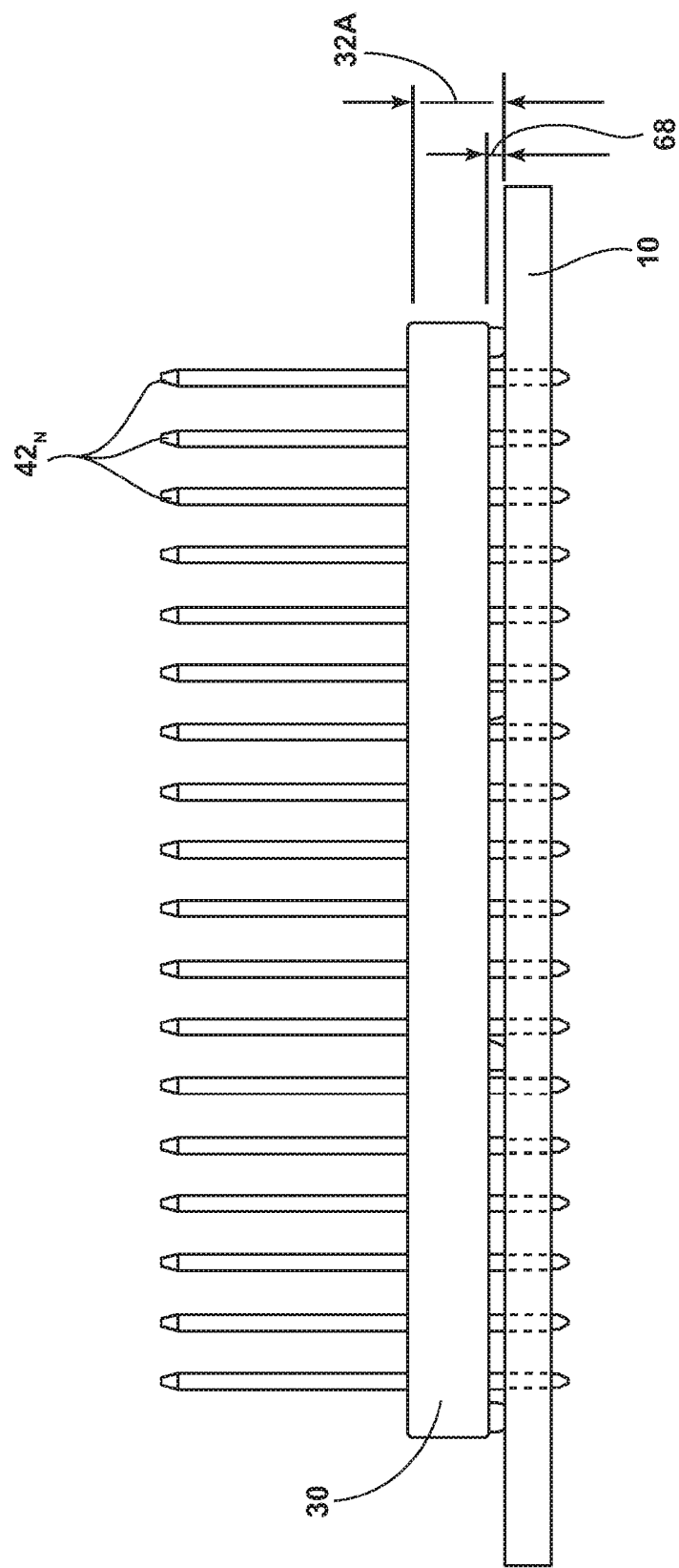
FIG. 5B is a side view of a terminal block attached to a circuit board.

In embodiments of the present disclosure, applying a sealing material 80 to vented terminal block 50 may more efficient and/or more effective than in some other designs. For example, and without limitation, one or more of side walls 56A, 56B, 56C, 56D may include a recess or opening 60 that may effectively reduce the surface area of the side wall and may create a larger opening into which a sealing material 80 may be inserted (see, e.g., FIGS. 3A-4B). A larger opening may facilitate inserting sealing material 80, for example, as the viscosity of sealing material 80 may prevent sealing material 80 from being inserted into relatively small openings. Additionally or alternatively, side walls 56A, 56B, 56C, 56D of vented terminal block 50 may be shorter than in other designs, which may also create a larger opening into which sealing material 80 may be inserted (see, e.g., FIGS. 2A and 2B). For example, and without limitation, the gap/distance 66 between one or more of side walls 56A, 56B, 56C, 56D and circuit board 10, in a mounted configuration, may be about 1 mm (see, e.g., FIGS. 2B and 5A), while the distance 68 between the bottom 36 of solid body 32 of terminal block 30 and circuit board 10 may be about 0.7 mm (see., e.g., FIG. 2C and 5B). In embodiments, gap/distance 66 may, for example, be at least 40% larger than distance 68. The embodiment generally illustrated/described in connection with FIG. 5A and the example dimensions thereof are provided as one non-limiting example of vented terminal block 50, and the present disclosure is not limited to the embodiment or dimensions shown/described in connection with FIG. 5A.

In embodiments, body 52 may include one or more apertures $72_M$ that may be configured for venting fluids (e.g., fluids 100, 102) from cavity 70 and/or may be referred to herein as venting apertures $72_M$. In embodiments, apertures $72_M$ may include one or more of a variety of shapes, sizes, configurations, and/or locations. For example, and without limitation, apertures $72_M$ may be generally circular and may be disposed between one or more electrical terminals $40_N$. In embodiments, electrical terminals $40_N$ may be arranged in rows and/or columns, and a row of apertures $72_M$ may be disposed between each row of electrical terminals $40_N$ and/or a column of apertures $72_M$ may be disposed between each column of electrical terminals $40_N$. In embodiments, apertures $72_M$ may be disposed equidistantly from two or more electrical terminals $40_N$. For example, and without limitation, one or more apertures $72_M$ may be disposed equidistantly from four electrical terminals $40_N$.

In embodiments, such as generally illustrated in FIGS. 3B and 4B, body 52 may include a lattice-like support structure (e.g., as opposed to the solid structure of solid body 32 of terminal block 30) that may be disposed at the lower surface 54A of body 52 and that may include a plurality of support beams 90 that may be connected between electrical terminals $40_N$ and/or side walls 56A, 56B, 56C, 56D. In embodiments, at least some of the support beams 90 may be disposed in one or more generally rectangular configurations and an aperture $72_M$ may be disposed substantially at the center of one or more of the rectangular configurations (e.g., centered between a plurality of electrical terminals 40). In embodiments, increasing the number and/or size of apertures $72_M$ may be desirable (e.g., to allow a greater amount of fluid, such as fluids 100, 102, to be vented from cavity 70) and the number and/or size of apertures $72_M$ may be optimized and/or maximized to the extent possible while maintaining the structural integrity of vented terminal block 50. In embodiments, a lattice-like structure may permit the height of side walls 56A, 56B, 56C, 56D and/or the thickness of body 52 to be less than the thickness 32A of body 32 of terminal block 30. For example, and without limitation, the thickness of body 32 may be about 2.8 mm, while the thickness 52A of body 52 may be about 0.5 mm and the height of side walls may be about 2.5 mm (e.g., including the 0.5 mm body thickness 52A). A reduced thickness of body 52 may permit cavity 70 to have a greater volume than cavity 34 of terminal block 30.

In embodiments, one or more apertures $72_M$ may include a tapered configuration such that the diameter of the aperture $72_M$ is larger at the lower surface 54A of body 52 and decreases toward the top surface 54B of body 52.

In embodiments, if a sealing material 80 is inserted into cavity 70, cavity fluid 100 (e.g., air) originally in cavity 70 may be permitted to vent out of cavity 70 via apertures $72_M$ (see, e.g., FIG. 2A). Venting original fluid 100 may permit the fluid pressure inside cavity 70 to remain relatively low, which may permit sealing material 80 to flow more easily, to more uniformly cover solder 18 within cavity 70, and/or to reduce and/or prevent the formation of air bubbles or air pockets. Additionally or alternatively, sealing material 80 may be configured to cure over a period of time and may generate a fluid 102 during curing (e.g., fumes, exhaust fluid, etc.). In embodiments, apertures $72_M$ may be configured to permit fluids generated during curing 102 to vent out of cavity 70, which may prevent and/or reduce the formation of air bubbles or air pockets. In embodiments, cavity 70 may include a size and/or volume sufficient to receive sealing material 80 and allow sealing material 80 to cover solder 18 while venting fluids 100, 102.

In embodiments, a method of forming a vented terminal block 50 may include providing a mold, such as for plastic injection molding. The mold may include various formations that may form to aspects of embodiments of vented terminal block 50. For example, and without limitation, the mold may include features that correspond to side walls 56A, 56B, 56C, 56D, feet 62A, 62B, 62C, 62D, recess 60, apertures $72_M$, and/or support beams 90. Electrical terminals $40_N$ may be placed in the mold and plastic may be injected into the mold to form around the electrical terminals $40_N$, which may result in a single, unitary vented terminal block 50 including body 52 and electrical terminals $40_N$. In embodiments, body 52 may be formed first (e.g., via injection molding, drillings, cutting, etc.) and electrical terminals $40_N$ may be inserted and/or pressed into body 52.

In embodiments, a method of assembling a circuit board assembly 28 and/or an electrical junction box 20, which may comprise circuit board assembly 28, may include disposing a vented terminal block 50 on and/or adjacent to circuit board 10, which may include inserting second portions $44_N$ of electrical terminals $40_N$ into and/or through corresponding apertures $16_N$ in circuit board 10. Upon complete insertion, second portions $44_N$ may extend beyond the bottom surface 14 of circuit board 10 and the bottoms 64A, 64B, 64C, 64D of feet 62A, 62B, 62C, 62D may be in contact with the top surface 12 of circuit board 10. In embodiments, second portions $44_N$ of electrical terminals $40_N$ may be soldered to circuit board 10. The soldering process may include solder 18 flowing through apertures $16_N$ to the top surface 12 of circuit board 10 (e.g., into cavity 70). In embodiments, a sealing material 80 may be applied to the solder 18 to prevent/reduce wear and/or corrosion. Applying the sealing material 80 may include inserting sealing material 80 into cavity 70 via recess 60 and venting fluid 100 that was originally in cavity 70 out of cavity 70 via venting apertures $72_M$. In embodiments, sealing material 80 may cure over a period of time, and fumes 102 may be vented out of cavity via apertures $72_M$, which may reduce the formation of air pockets and/or air bubbles. In embodiments, apertures $72_M$ may be sized and/or positioned to optimize fluid flow (e.g., venting of fluids 100, 102).

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Although only certain embodiments have been described above with a certain degree of particularity, those skilled in the art could make numerous alterations to the disclosed embodiments without departing from the scope of this disclosure. Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. It is intended that all matter contained in the above description or shown in the accompanying drawings shall be interpreted as illustrative only and not limiting. Changes in detail or structure may be made without departing from the present disclosure.

What is claimed is:

1. A circuit board assembly, comprising:
   a circuit board;
   a vented terminal block connected to the circuit board, the vented terminal block including:
   a body supporting a plurality of electrical terminals, the body comprising:
   a plurality of apertures extending through the body;
   wherein a cavity is defined between the body and the circuit board, the body includes an opening configured to receive a sealing fluid, the plurality of electrical terminals extend through the body independently of the plurality of apertures that extend through the body, and the plurality of electrical terminals are electrically connected to the circuit board.

2. The circuit board assembly of claim 1, wherein the vented terminal block includes a plurality of side walls, and a thickness of the body is about 20% of a height of the plurality of side walls.

3. The circuit board assembly of claim 1, wherein the plurality of electrical terminals are electrically connected with the circuit board in a plurality of rows and the plurality of apertures are disposed in one or more rows between the plurality of rows of electrical terminals.

4. The circuit board assembly of claim 2, wherein at least some of the plurality of apertures are substantially centered between respective electrical terminals of the plurality of electrical terminals.

5. The circuit board assembly of claim 1, wherein at least one of the plurality of apertures is substantially equidistant from four respective electrical terminals of the plurality of electrical terminals.

6. The circuit board assembly of claim 1, wherein the body includes a plurality of side walls extending toward the circuit board.

7. The circuit board assembly of claim 1, wherein the plurality of electrical terminals include portions extending above the body.

8. The circuit board assembly of claim 1, wherein a thickness of the body is thinner than a thickness of the circuit board.

9. The circuit board assembly of claim 6, wherein the opening is disposed in at least one side wall of the plurality of side walls, reducing a surface area of the at least one side wall.

10. The circuit board assembly of claim 1, wherein a thickness of the body is about 0.5 mm.

11. The circuit board assembly of claim 1, wherein at least one aperture of the plurality of apertures includes a tapered configuration such that a diameter of the at least one aperture is greater at a bottom side of the body than at a top side of the body.

12. An electrical junction box comprising the circuit board assembly of claim 1.

13. A vented electrical terminal block, comprising:
   a body comprising:
   a plurality of side walls extending from the body; and
   one or more apertures extending through the body; and
   a plurality of electrical terminals connected to the body independently of the one or more apertures;
   wherein a cavity is defined by an underside of the body, the cavity is configured to receive a cavity fluid, and at least one side wall of the plurality of side walls includes an opening configured to receive a sealing fluid.

14. The vented electrical terminal block of claim 13, wherein at least one aperture of the one or more apertures includes a tapered configuration such that a diameter of the at least one aperture is greater at a bottom side of the body than at a top side of the body.

15. A method of assembling an electrical junction box, the method comprising:
   connecting a vented terminal block to a circuit board,
   soldering electrical terminals of the vented terminal block to the circuit board;
   inserting a sealing fluid into a cavity defined between the circuit board and the vented terminal block; and
   venting a cavity fluid out of the cavity via a plurality of apertures in the vented terminal block; wherein the electrical terminals of the vented terminal block extend through a body of the vented terminal block independently of the plurality of apertures in the vented terminal block.

16. The method of claim 15, wherein connecting the vented terminal block with the circuit board includes inserting portions of electrical terminals into corresponding apertures in the circuit board.

17. The method of claim 15, wherein the vented terminal block includes a body, the body comprising:
   a plurality of side walls extending from the body;
   a plurality of feet extending from the body beyond the plurality of side walls to support the body on the circuit board; and,
   a plurality of apertures extending through the body;
   wherein at least one side wall of the plurality of side walls includes an opening, the sealing fluid is inserted through the opening in the at least one side wall, and the plurality of apertures are configured to vent said cavity fluid from the cavity when said sealing fluid is introduced into the cavity via the opening.

18. The method of claim 15, wherein the cavity fluid includes an exhaust fluid resulting from a curing of the sealing fluid.

19. The method of claim 15, wherein the venting of the cavity fluid limits a formation of gas bubbles in the sealing fluid.

20. The method of claim 15, wherein soldering electrical terminals includes soldering portions of the electrical terminals that extend beyond a bottom surface of the circuit board following insertion; wherein during the soldering of the portions of the electrical terminals, solder flows through the circuit board from the bottom surface to a top surface of the circuit board; and, wherein the sealing fluid is configured to protect the solder at the top surface.

* * * * *